United States Patent
Medvedeva et al.

(10) Patent No.: US 7,035,446 B2
(45) Date of Patent: Apr. 25, 2006

(54) QUALITY MEASUREMENT OF AN AERIAL IMAGE

(75) Inventors: Marina M. Medvedeva, Moscow (RU); Jaroslav V. Kalinin, Moscow (RU); Stanislav V. Aleshin, Moscow (RU); Nadya Strelkova, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 748 days.

(21) Appl. No.: 10/155,620

(22) Filed: May 22, 2002

(65) Prior Publication Data

US 2003/0219154 A1 Nov. 27, 2003

(51) Int. Cl.
G06K 9/00 (2006.01)
G06F 17/50 (2006.01)

(52) U.S. Cl. .......................................... 382/144; 716/21
(58) Field of Classification Search ...................... None
See application file for complete search history.

(56) References Cited

U.S. PATENT DOCUMENTS

| | | | | |
|---|---|---|---|---|
| 5,795,688 A | * | 8/1998 | Burdorf et al. | 430/30 |
| 5,801,954 A | * | 9/1998 | Le et al. | 716/21 |
| 5,825,647 A | * | 10/1998 | Tsudaka | 700/57 |
| 5,900,338 A | * | 5/1999 | Garza et al. | 430/5 |
| 5,991,477 A | | 11/1999 | Ishikawa et al. | |
| 6,016,357 A | * | 1/2000 | Neary et al. | 382/144 |
| 6,081,659 A | * | 6/2000 | Garza et al. | 716/21 |
| 6,269,472 B1 | | 7/2001 | Garza et al. | |
| 6,334,209 B1 | | 12/2001 | Hashimoto et al. | |
| 6,578,190 B1 | * | 6/2003 | Ferguson et al. | 716/21 |
| 6,868,176 B1 | * | 3/2005 | Sugawara | 382/151 |
| 6,873,720 B1 | * | 3/2005 | Cai et al. | 382/149 |
| 2002/0166107 A1 | | 11/2002 | Capodieci et al. | |
| 2003/0059104 A1 | * | 3/2003 | Mitsui | 382/145 |
| 2004/0057610 A1 | * | 3/2004 | Filseth et al. | 382/144 |

* cited by examiner

*Primary Examiner*—Wenpeng Chen
*Assistant Examiner*—Utpal Shah
(74) *Attorney, Agent, or Firm*—Fitch, Even, Tabin & Flannery

(57) ABSTRACT

A method of measuring the quality of a simulated aerial image includes receiving as input a mask pattern for a chip design, simulating an aerial image of the mask pattern, calculating an error area representative of a deviation between an ideal boundary of the chip design and a boundary of the simulated aerial image, calculating maximum and average end-of-line deviations between the ideal boundary of the chip design and the boundary of the simulated aerial image, and displaying a worst quality area in the simulated aerial image as a function of the error area and the maximum and average end-of-line deviations for visual inspection.

23 Claims, 5 Drawing Sheets

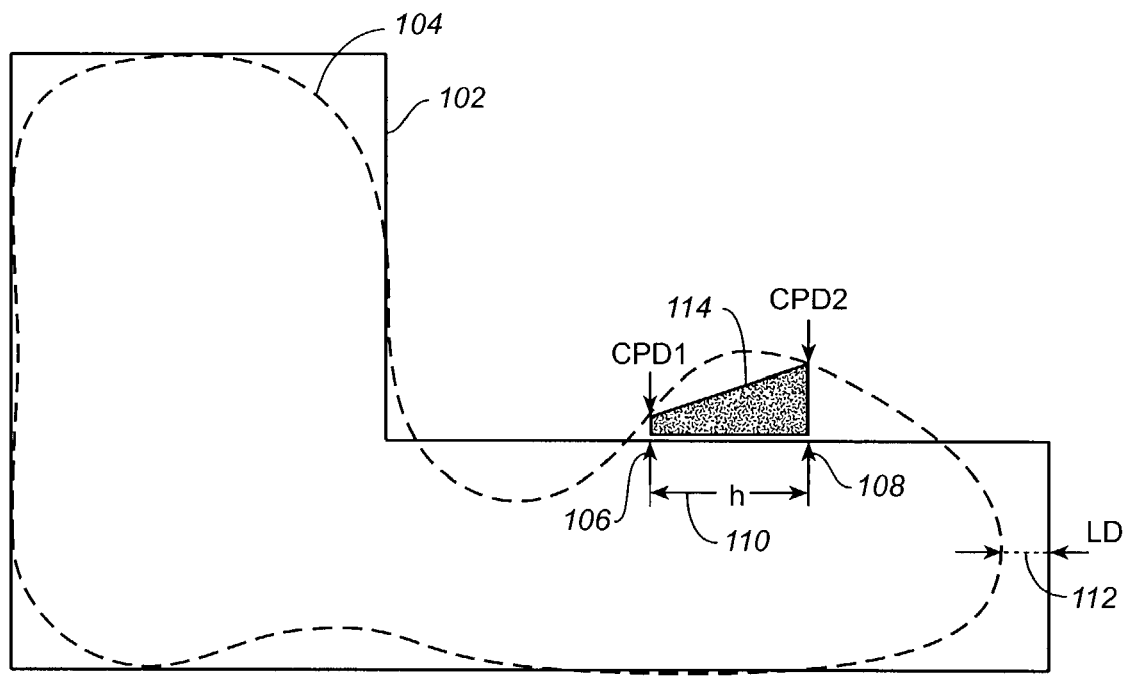
FIG._1
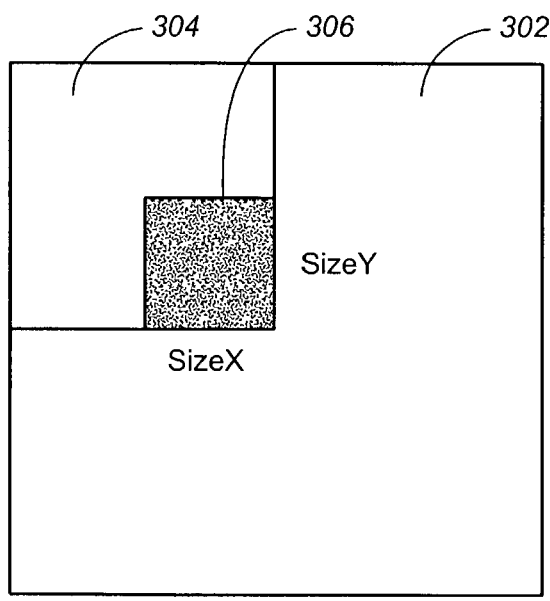
FIG._3

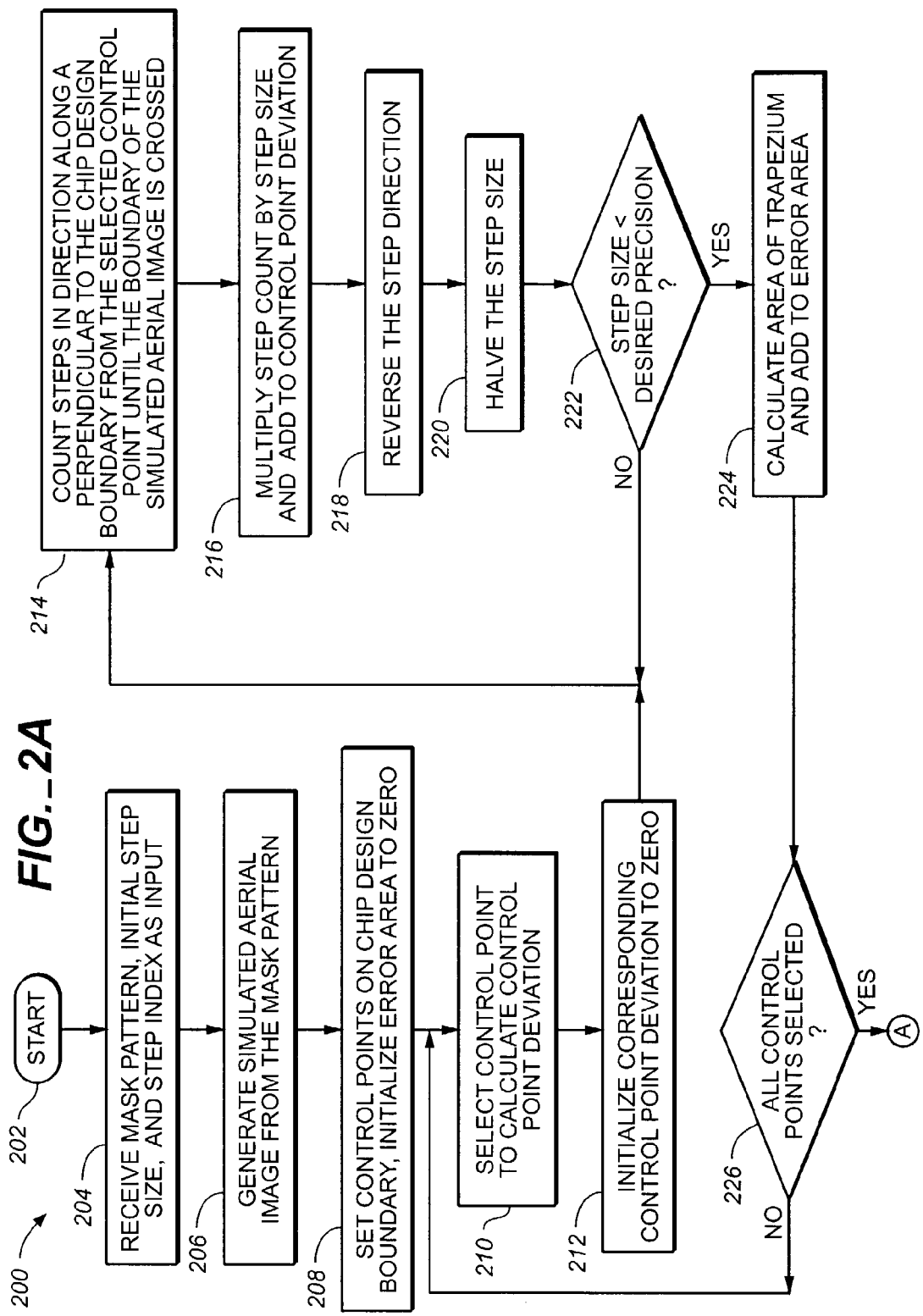
FIG._2A

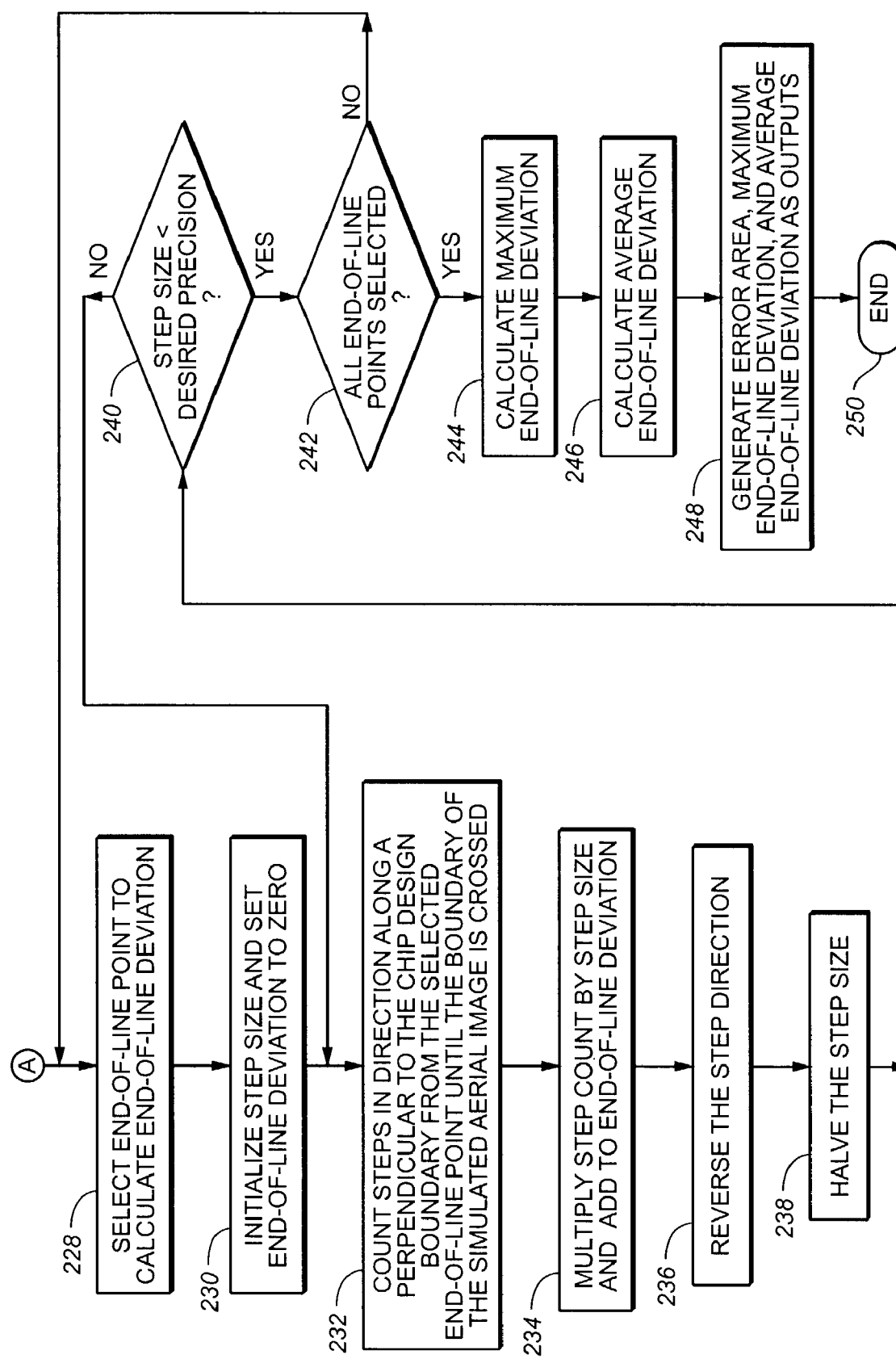
FIG._2B

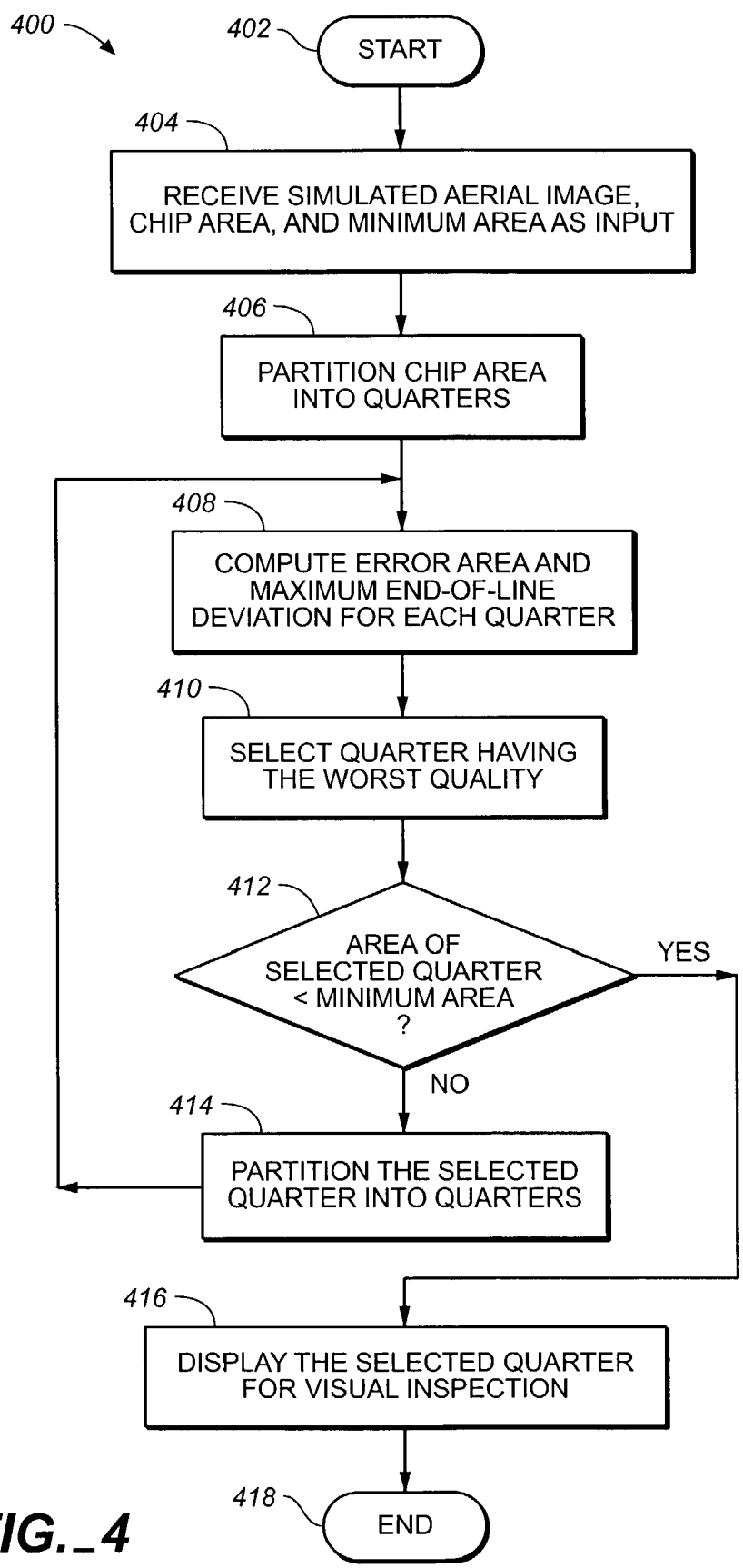
FIG._4

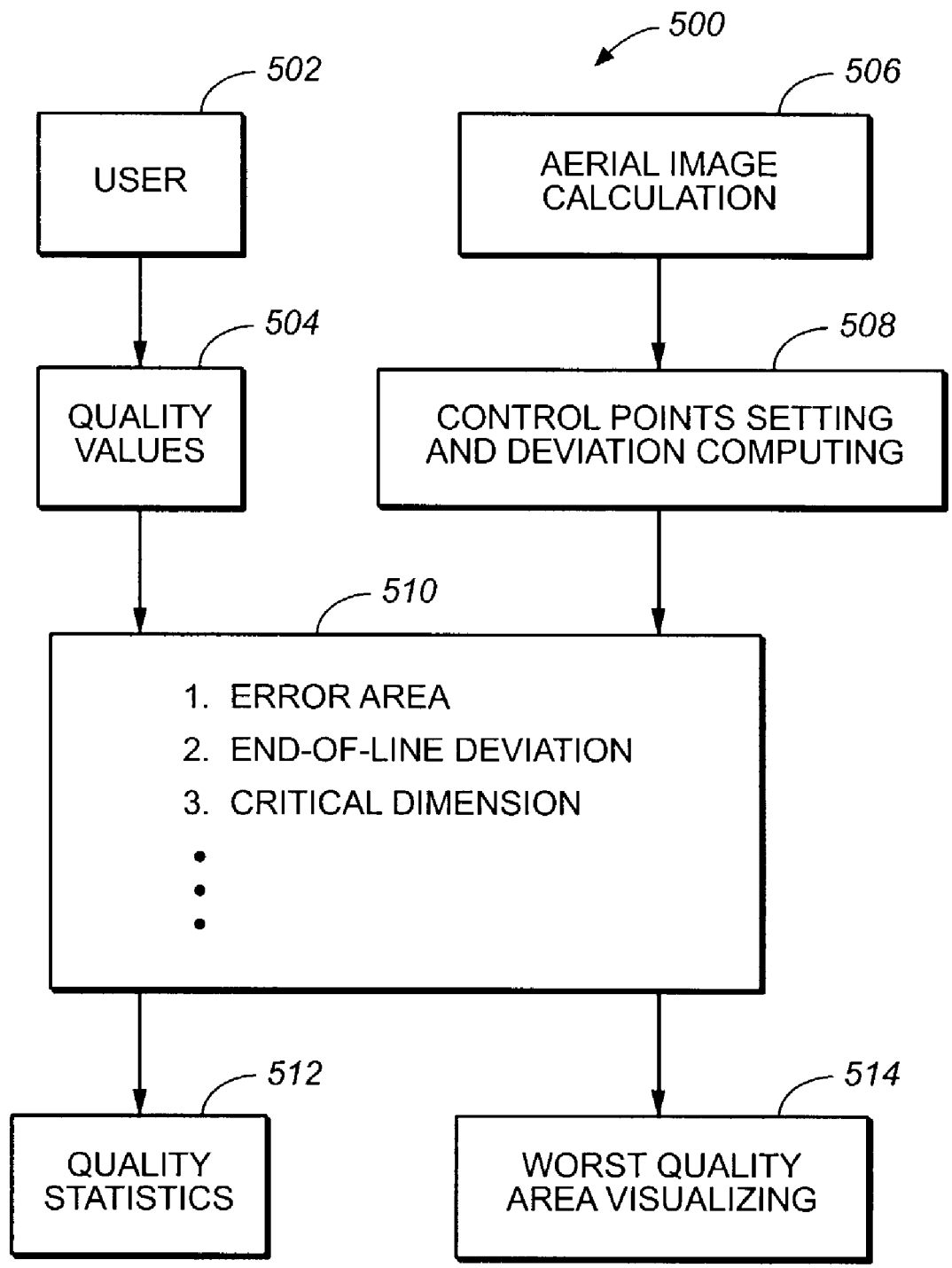
FIG._5

QUALITY MEASUREMENT OF AN AERIAL IMAGE

CROSS-REFERENCE TO RELATED APPLICATIONS

This application is related to U.S. patent application Ser. No. 09/233,885 for "HYBRID AERIAL IMAGE SIMULATION", filed on Jan. 20, 1999, by Medvedeva, et. al, now U.S. Pat. No. 6,171,731, issued on Jan. 9, 2001, incorporated herein by reference.

BACKGROUND OF THE INVENTION

The present invention relates generally to locating deviations from a pattern in a simulated aerial image. More specifically, but without limitation thereto, the present invention relates to a method of measuring the quality of a simulated aerial image.

Photolithography is a common technique employed in the manufacture of semiconductor devices. Typically, a semiconductor wafer is coated with a layer of light-sensitive material, called photoresist. Using a patterned mask, or reticle, the semiconductor wafer is exposed to light, typically actinic radiation, projected through the reticle onto the photoresist, which is chemically altered in the areas exposed to the light. The chemically altered areas of the photoresist are removed by chemical etching, leaving a pattern of photoresist lines on the semiconductor wafer that ideally is identical to the reticle pattern. The photoresist pattern is used to create semiconductor devices on the semiconductor wafer.

The degree to which the resulting photoresist pattern corresponds to the reticle pattern is critical to the fabrication of semiconductor devices on the semiconductor wafer. Errors or deviations from the reticle pattern in the photoresist pattern may result in malfunction of semiconductor devices formed on the semiconductor wafer. The shape and proximity of features in the reticle pattern introduce optical proximity effects such as diffraction that may result in errors and deviations in the photoresist pattern.

The variation of light intensity as a function of position in the image plane of the optical projection system used to project the reticle (mask) pattern defines the aerial image. Methods for simulating the aerial image, for example, as described in U.S. Pat. No. 6,171,731, are used in optical proximity correction (OPC) techniques to modify the reticle pattern until the resulting simulated aerial image is within a selected tolerance from the ideal boundary of the chip design. The modified reticle pattern is then used to fabricate a mask for the actual production of semiconductor devices on semiconductor wafers.

SUMMARY OF THE INVENTION

In one aspect of the present invention, a method of measuring the quality of a simulated aerial image includes receiving as input a mask pattern of a chip design, simulating an aerial image of the mask pattern, calculating an error area representative of a deviation between an ideal boundary of the chip design and a boundary of the simulated aerial image of the mask pattern, calculating maximum and average end-of-line deviations between the ideal boundary of the chip design and the boundary of the simulated aerial image of the mask pattern, and displaying a worst quality area in the simulated aerial image as a function of the error area and the maximum and average end-of-line deviations for visual inspection.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates a diagram of an ideal boundary of a chip design 102 and a boundary of a simulated aerial image 104;

FIGS. 2A and 2B illustrate a flow chart for computing the error area and end-of-line deviation of the simulated aerial image in accordance with an embodiment of the present invention;

FIG. 3 illustrates a method of searching the area of a chip enclosing the simulated aerial image to find the local area of the simulated aerial image having the worst case image quality in accordance with an embodiment of the present invention;

FIG. 4 illustrates a flow chart of the method illustrated in FIG. 3; and

FIG. 5 illustrates a block diagram of a computer program for implementing the method of FIG. 3.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

The variation of light intensity as a function of position in the image plane of an optical projection system used to project a reticle pattern defines an aerial image. The aerial image therefore represents substantially the optical information contained in the reticle pattern that is recorded in the photoresist layer of a semiconductor wafer. By simulating the aerial image and comparing the simulated aerial image to the ideal boundary of the chip design, the time required to design a mask for the manufacture of an integrated circuit may be substantially reduced. A simulated aerial image may also be used for correcting mask pattern deviations resulting from optical proximity effects, and to find the location in the reticle pattern that results in the worst case error.

In accordance with an embodiment of the present invention, a method of locating an area of worst quality in a simulated aerial image includes receiving as input a mask pattern of a chip design, simulating an aerial image of the mask pattern, and calculating a representative value of a deviation between an ideal boundary of the chip design and a boundary of the simulated aerial image of the mask pattern. The simulated aerial image is partitioned into quarters, a representative value of a deviation between the mask pattern and the simulated aerial image is calculated within each of the quarters, and a selected quarter is identified for which the representative value is substantially equal to a maximum value. The selected quarter is recursively partitioned into new quarters until the selected quarter is smaller than a selected minimum area. The resulting selected quarter is the location of the worst quality in the simulated aerial image, which may be displayed for visual inspection.

FIG. 1 illustrates a diagram of an ideal boundary of a chip design 102 and a simulated aerial image 104. Also shown are control points 106 and 108, a control point spacing 110, an end-of-line line deviation 112, and a trapezium 114.

The ideal boundary of the chip design 102 is preferably expressed initially in the form of a transmission function in GDS-2 format, a standard data format used for chip design. The transmission function provides a geometric description of the mask pattern. The simulated aerial image 104 may be generated from a mask pattern by an aerial image simulator such as described in U.S. Pat. No. 6,171,731. The deviation between the ideal boundary of the chip design 102 and the boundary of the simulated aerial image 104 may be expressed as an area, called the error area, and as maximum and average end-of-line deviation between the ideal boundary of the chip design 102 and the boundary of the simulated aerial image 104. The error area and maximum and average end-of-line deviation may be approximated, for example, by the method illustrated in the flow chart of FIG. 2.

FIGS. 2A and 2B illustrate a flow chart 200 for computing the error area and end-of-line deviation of the simulated aerial image in accordance with an embodiment of the present invention.

Step 202 is the entry point of the flow chart 200.

In step 204, the mask pattern data for a chip design is received as input, preferably in the form of a mask transmission function in GDS-2 format.

In step 206, an aerial image is simulated from the mask pattern, for example, by the method described in U.S. Pat. No. 6,171,731.

In step 208, the locations of the control points 106 and 108 are set on the ideal boundary of the chip design 102 separated by a control point spacing 110. The control point spacing may be, for example, evenly distributed along the ideal boundary of the chip design 102. In this simple example, only two control points are shown. In practice, however, control points are set along the entire ideal boundary of the chip design 102, each separated from another by the control point spacing 110. Also, the error area is initialized to zero.

In step 210, a control point is selected for calculating a corresponding control point deviation.

In step 212, the control point deviation is initialized to zero.

In step 214, steps are counted along a perpendicular to the ideal boundary of the chip design 102 from the control point toward the boundary of the simulated aerial image 104 until the boundary of the simulated aerial image 104 is crossed.

In step 216, the step count is multiplied by the step size and added to the control point deviation.

In step 218, the step direction is reversed to point to the boundary of the simulated aerial image that was just crossed.

In step 220, the step size is halved. For example, if the current step size is equal to the control point spacing 110, then the new step size will be one-half the control point spacing 110.

In step 222, if the new step size is less than the desired precision, then control is transferred to step 214. Otherwise, control is transferred to step 224. The desired precision is the maximum tolerance allowed between the measured control point deviation and the actual control point deviation.

Alternatively, the control point deviation may be found by calculating the following formula:

$$CPD = Step \times \left[ N + \sum_{i=1}^{p} \frac{(-1)^{j_i}}{2^i} \right] \quad (1)$$

where CPD is the control point deviation, Step is the initial length of the step of the simulation grid, N is the whole number of steps counted from the corresponding control point along a perpendicular to the ideal boundary of the chip design 102 before crossing the boundary of the simulated aerial image 104, and p is the number of times the step size is halved to reach the desired precision. For example, if Step is equal to one-tenth of the control point spacing 110, and the desired precision is Step/2560, then p is equal to eight. A typical value for Step is 10 nm. The exponent $j_i$ toggles between the values of zero and one. When the direction from the current step to the boundary of the simulated aerial image 104 is away from the ideal boundary of the chip design 102, $j_i$ is equal to zero. When the direction from the current step to the boundary of the simulated aerial image 104 is toward the ideal boundary of the chip design 102, $j_i$ is equal to one. The sum of the positive and negative terms is equal to the fractional step that is added to the whole number of steps N. The result is multiplied by the initial step size to equal the control point deviation CPD.

In step 224, the area of the trapezium 114 bounded by the current control point deviation, the ideal boundary of the chip design 102, the previous control point deviation, and a line connecting the end points of the current and the previous control point deviations is calculated and added to the error area. An exception to this step occurs if there is no previous control point deviation, in which case the error area is unchanged.

An example of a calculation of an area of a trapezium 114 is illustrated by the shaded area in FIG. 1. The sum of the areas of the trapeziums defined by all pairs of control points along the ideal boundary of the chip design 102 is calculated from the following formula:

$$S_{error} = \sum_{CPs} \frac{CPD1 + CPD2}{2} h \quad (2)$$

where $S_{error}$ is the error area, CPD1 and CPD2 are the control point deviations corresponding to each pair of control points CP, and h is the control point spacing. The value of h determines the accuracy of the approximation, and typically is equal to or less than 10 nm. In specific applications, h may vary along the ideal boundary of the chip design 102, having greater values where the boundary of the simulated aerial image 104 is nearly parallel to the ideal boundary of the chip design 102 and having smaller values where the boundary of the simulated aerial image 104 is more sharply angled with respect to the ideal boundary of the chip design 102.

In step 226, if all control points have been selected for calculating a corresponding control point deviation, then control is transferred to step 228. Otherwise, control is transferred to step 210.

In step 228, an end-of-line point is selected for calculating the corresponding end-of-line deviation. An end-of-line point is located at the middle of a line segment of the ideal boundary of the chip design 102, shown as 112 in FIG. 1.

In step 230, the step size is reset to the initial step size, and the corresponding end-of-line deviation is initialized to zero.

In step 232, steps are counted along a perpendicular to the ideal boundary of the chip design 102 from the end-of-line point toward the boundary of the simulated aerial image 104 until the boundary of the simulated aerial image 104 is crossed.

In step 234, the step count is multiplied by the step size and added to the end-of-line deviation.

In step 236, the step direction is reversed.

In step 238, the step size is halved.

In step 240, if the new step size is less than the desired precision, then control is transferred to step 242. Otherwise, control is transferred to step 232.

Alternatively, the end-of-line deviations LD corresponding to the end-of-line points EolP may be calculated from the following formula:

$$LD = Step \times \left[ N + \sum_{i=1}^{p} \frac{(-1)^{ji}}{2^i} \right] \quad (3)$$

In step 242, if all end-of-line points have been selected for calculating a corresponding end-of-line deviation, then control is transferred to step 244. Otherwise, control is transferred to step 228.

In step 244, the maximum end-of-line deviation is calculated, for example, from the following formula:

$$LD_{maximum} = \max(LD1, LD2, \ldots LDN_{EolP}) \quad (4)$$

where $N_{EolP}$ is the number of end-of-line points.

In step 246, the average end-of-line deviation is calculated, for example, from the following formula:

$$LD_{average} = \frac{1}{N_{EolP}} \left[ \sum_{N_{EolP}} LD \right] \quad (5)$$

The average end-of-line deviation is one of the most important quality characteristics of the optical proximity correction (OPC) procedure, and is also used for quality inspections.

In step 248, the error area and the maximum and average end-of-line deviations of the simulated aerial image are generated as output.

Although a preferred method of calculating area has been disclosed herein, other methods of computing the area of an aerial image are within the scope of the present invention.

Step 250 is the exit point of the flow chart 200.

FIG. 3 illustrates a method of searching the area of a chip enclosing the simulated aerial image 104 to find the local area of the simulated aerial image 104 having the worst case image quality in accordance with an embodiment of the present invention. First, the chip area 302 is divided into quarters. The error area and the maximum end-of-line deviation are computed as described above for each quarter, and the quarter 304 having the worst quality is selected. The worst quality is defined as a maximum value of a function of the error area and the maximum end-of-line deviation. The worst quality function may be, for example, the sum of the error area and the maximum end-of-line deviation.

The quarter 304 is then divided into quarters, and the error area and the maximum end-of-line deviation are computed for each of the quarters of the quarter 304. The quarter 306 having the worst quality is selected, and the cycle continues recursively until the selected quarter having the worst quality has less than a selected minimum area having the dimensions SizeX and SizeY as shown in the shaded area of FIG. 3. The local area of the chip having the worst quality defined by the selected quarter may then be magnified and displayed for visual inspection.

FIG. 4 illustrates a flow chart 400 of the search method illustrated in FIG. 3.

Step 402 is the entry point of the flow chart 400.

In step 404, the simulated aerial image 104, the chip area 302 enclosing the simulated aerial image 104, and a selected minimum area are received as input.

In step 406, the chip area 302 enclosing the simulated aerial image 104 is partitioned into quarters.

In step 408, the error area and the maximum end-of-line deviation are computed for each of the quarters.

In step 410, the quarter having the worst quality is selected.

In step 412, if the area of the quarter is less than the selected minimum area, control is transferred to step 416. Otherwise, control is transferred to step 414.

In step 414, the selected quarter having the worst quality is partitioned into quarters, and control is transferred to step 408.

In step 416, the selected quarter is displayed for visual inspection or generated as output. Alternatively, the coordinates of the selected quarter may be generated as output for further processing.

Step 418 is the exit point of the flow chart 400.

The flow charts illustrated in FIGS. 2 and 4 may be embodied in a computer program product and implemented by instructions for a computer according to well known programming techniques to perform the following functions:

receiving as input a mask pattern for a chip design;

simulating an aerial image of the mask pattern;

calculating an error area representative of a deviation between an ideal boundary of the chip design and a boundary of the simulated aerial image;

calculating maximum and average end-of-line deviations between the ideal boundary of the chip design and the boundary of the simulated aerial image; and displaying a worst quality area in the simulated aerial image for visual inspection.

The above functions may include one or more of the following:

partitioning the simulated aerial image into a plurality of areas, for example, quarters;

calculating a representative value of a deviation between the chip design and the simulated aerial image within each of the plurality of areas;

identifying a selected area among the plurality of areas for which the representative value is equal to a selected value, for example, a maximum value;

recursively partitioning the selected area into a new plurality of areas, calculating a representative value of a deviation between the chip design and the simulated aerial image within each of the new plurality of areas, and identifying a selected area among the new plurality of areas for which the representative value is equal to the selected value until the selected area is smaller than a selected minimum area; and calculating a representative value of a deviation between the chip design and the simulated aerial image by approximating an error area between an ideal boundary of the chip design and a boundary of the simulated aerial image and by calculating end-of-line deviations from an ideal boundary of the chip design to a boundary of the simulated aerial image and selecting the maximum end-of-line deviation.

FIG. 5 illustrates a block diagram 500 of a computer program for implementing the method illustrated in FIG. 3.

Block 502 represents the user controlling the operation of the computer program. The computer program may be implemented according to well known techniques, for example, on a standard personal computer (PC).

Block 504 represents quality values received as input to the computer program that are entered by the user. The quality values include the initial step size and the control point spacing.

Block 506 represents the calculation of the simulated aerial image from the mask pattern data, for example, as described in U.S. Pat. No. 6,171,731.

Block 508 represents setting the control points along the ideal boundary of the chip design and computing the error area and end-of-line deviation as described above with respect to FIGS. 2A–2C.

Block 510 represents generating the representative values for the error area, the end-of-line deviation, and the critical dimensions. A critical dimension is a measured distance between two opposite boundaries of the simulated aerial image or between two opposite edges of a polygon inside the simulated aerial image. The series of dots represents the generation of other values from the mask pattern data and the simulated aerial image according to well known techniques that may be useful in specific applications.

Block 512 represents the statistical outputs of the computer program representative of the quality of the simulated aerial image, that is, the degree to which the boundary of the simulated aerial image conforms to the ideal boundary of the chip design.

Block 514 represents the display of the local area of the simulated aerial image having the worst quality. The user may inspect the display to determine what corrections should be made to the mask to improve the overall quality of the simulated aerial image. The corrections may then be iteratively entered into the mask data until the desired quality of the simulated aerial image is achieved.

Although the methods of the present invention illustrated above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of measuring the quality of a simulated aerial image comprising:
   receiving as input a mask pattern for a chip design;
   simulating an aerial image of the mask pattern;
   calculating an error area representative of a deviation between an ideal boundary of the chip design and a boundary of the simulated aerial image;
   calculating maximum and average end-of-line deviations between the ideal boundary of the chip design and the boundary of the simulated aerial image; and
   displaying a worst quality area in the simulated aerial image for visual inspection.

2. The method of claim 1 further comprising partitioning an area including the simulated aerial image into quarters.

3. The method of claim 2 further comprising calculating a representative value of a deviation between the ideal boundary of the chip design and the boundary of the simulated aerial image within each of the quarters.

4. The method of claim 3 further comprising identifying a selected quarter for which the representative value is a maximum value.

5. The method of claim 4 further comprising recursively partitioning the selected quarter into new quarters, calculating a representative value of a deviation between the chip design and the simulated aerial image within each of the new quarters, and identifying a selected quarter for which the representative value is a maximum value until the selected quarter has an area that is smaller than a selected minimum area.

6. The method of claim 5 further comprising displaying the selected quarter for visual inspection of a local area having the worst quality in the simulated aerial image.

7. The method of claim 1 wherein calculating a representative value of a deviation between the ideal boundary of the chip design and the boundary of the simulated aerial image comprises approximating an error area between the ideal boundary of the chip design and the boundary of the simulated aerial image.

8. The method of claim 7 wherein approximating an error area between the ideal boundary of the chip design and the boundary of the simulated aerial image comprises:
   locating a plurality of control points on the ideal boundary of the chip design;
   finding a perpendicular distance from each of the plurality of control points respectively to a plurality of corresponding points of intersection on the boundary of the simulated aerial image; and
   calculating an area of a trapezium formed by each pair of control points and corresponding points of intersection on the boundary of the simulated aerial image.

9. The method of claim 7 comprising:
   (a) receiving an initial step size and a step index as input;
   (b) setting control points on the ideal boundary of the chip design separated by a control point spacing;
   (c) counting steps in a step direction along a perpendicular to the ideal boundary of the chip design from each control point toward the boundary of the simulated aerial image until the boundary of the simulated aerial image is crossed;
   (d) reversing the step direction;
   (e) halving the step size;
   (f) if the step size is less than a desired precision, then transferring control to (g), otherwise transferring control to (c); and
   (g) calculating a sum of the areas of each trapezium bounded by the boundary of the chip design, the control point deviations, and a line connecting end points of the control point deviations.

10. The method of claim 1 wherein calculating a value representative of a deviation between the ideal boundary of the chip design and the boundary of the simulated aerial image comprises calculating a plurality of end-of-line deviations.

11. The method of claim 10 further comprising selecting a maximum end-of-line deviation from the plurality of end-of-line deviations.

12. The method of claim 10 comprising:
   (a) calculating the plurality of end-of-line deviations from the ideal boundary of the chip design to the boundary of the simulated aerial image at each of a plurality of end-of-line points; and
   (b) finding a maximum end-of-line deviation from the plurality of end-of-line deviations.

13. A computer program product for measuring the quality of a simulated aerial image comprising:
a medium for embodying a computer program for input to a computer; and
a computer program embodied in the medium for causing the computer to perform the following functions:
receiving as input a mask pattern for a chip design;
simulating an aerial image of the mask pattern;
calculating an error area representative of a deviation between an ideal boundary of the chip design and a boundary of the simulated aerial image;
calculating maximum and average end-of-line deviations between the ideal boundary of the chip design and the boundary of the simulated aerial image; and
displaying a worst quality area in the simulated aerial image as a function of the error area and the maximum and average end-of-line deviations for visual inspection.

14. The computer program product of claim 13 further comprising partitioning an area including the simulated aerial image into quarters.

15. The computer program product of claim 14 further comprising calculating a representative value of a deviation between the ideal boundary of the chip design and the boundary of the simulated aerial image within each of the quarters.

16. The computer program product of claim 15 further comprising identifying a selected quarter for which the representative value is a maximum value.

17. The computer program product of claim 16 further comprising recursively partitioning the selected quarter into new quarters, calculating a representative value of a deviation between the ideal boundary of the chip design and the boundary of the simulated aerial image within each of the new quarters, and identifying a selected quarter for which the representative value is a maximum value until the selected quarter has an area that is smaller than a selected minimum area.

18. The computer program product of claim 13 wherein calculating a representative value of a deviation between the ideal boundary of the chip design and the boundary of the simulated aerial image comprises approximating an error area between a boundary of the mask pattern and a boundary of the simulated aerial image.

19. The computer program product of claim 18 wherein approximating an error area between the ideal boundary of the chip design and the boundary of the simulated aerial image comprises:

locating a plurality of control points on the ideal boundary of the chip design;
finding a perpendicular distance from each of the plurality of control points respectively to a plurality of corresponding points of intersection on the boundary of the simulated aerial image; and
calculating an area of a trapezium formed by each pair of control points and corresponding points of intersection on the boundary of the simulated aerial image.

20. The computer program product of claim 18 further comprising:
(a) receiving an initial step size and a step index as input;
(b) setting control points on the ideal boundary of the chip design separated by a control point spacing;
(c) counting steps in a step direction along a perpendicular to the ideal boundary of the chip design from each control point toward a boundary of the simulated aerial image until the boundary of the simulated aerial image is crossed;
(d) reversing the step direction;
(e) halving the step size;
(f) if the step size is less than a desired precision, then transferring control to (g), otherwise transferring control to (c); and
(g) calculating a sum of the areas of each trapezium bounded by the ideal boundary of the chip design, the control point deviations, and a line connecting end points of the control point deviations.

21. The computer program product of claim 13 wherein calculating a value representative of a deviation between the ideal boundary of the chip design and the boundary of the simulated aerial image comprises calculating a plurality of end-of-line deviations.

22. The computer program product of claim 21 further comprising selecting a maximum end-of-line deviation from the plurality of end-of-line deviations.

23. The computer program product of claim 22 further comprising:
(a) calculating the plurality of end-of-line deviations from the ideal boundary of the chip design to the boundary of the simulated aerial image at each of a plurality of end-of-line points; and
(b) finding a maximum end-of-line deviation from the plurality of end-of-line deviations.

* * * * *